Ｕnited States Patent [19]

Burns

[11] Patent Number: 5,895,232
[45] Date of Patent: *Apr. 20, 1999

[54] THREE-DIMENSIONAL WARP-RESISTANT INTEGRATED CIRCUIT MODULE METHOD AND APPARATUS

[75] Inventor: Carmen D. Burns, Austin, Tex.

[73] Assignee: Staktek Corporation, Austin, Tex.

[*] Notice: This patent is subject to a terminal disclaimer.

[21] Appl. No.: 08/888,850

[22] Filed: Jul. 7, 1997

Related U.S. Application Data

[60] Division of application No. 08/514,294, Aug. 11, 1995, Pat. No. 5,801,437, which is a continuation-in-part of application No. 08/280,968, Jul. 27, 1994, Pat. No. 5,581,121, which is a division of application No. 08/037,830, Mar. 29, 1993, Pat. No. 5,369,056.

[51] Int. Cl.⁶ .................................................. H01L 21/44
[52] U.S. Cl. ........................ 438/107; 438/109; 438/118
[58] Field of Search ............................ 438/107, 109, 438/118

[56] References Cited

U.S. PATENT DOCUMENTS

| | | | |
|---|---|---|---|
| 3,436,604 | 4/1969 | Hyltin et al. | 317/101 |
| 3,614,546 | 10/1971 | Avins | 317/234 R |
| 3,713,893 | 1/1973 | Shirland | 437/205 X |
| 3,739,462 | 6/1973 | Hasty | 29/577 |
| 4,103,318 | 7/1978 | Schwede | 361/388 |
| 4,158,745 | 6/1979 | Keller | 174/52 FP |
| 4,241,493 | 12/1980 | Andrulits et al. | 437/209 X |
| 4,288,841 | 9/1981 | Gogal | 361/414 |
| 4,321,418 | 3/1982 | Dran et al. | 264/102 X |
| 4,437,235 | 3/1984 | McIver | 29/840 |
| 4,451,973 | 6/1984 | Tateno et al. | 29/588 |
| 4,521,828 | 6/1985 | Fanning | 361/386 |
| 4,525,921 | 7/1985 | Carson et al. | 29/577 |
| 4,530,152 | 7/1985 | Roche et al. | 29/588 |
| 4,630,172 | 12/1986 | Stenerson et al. | 361/386 |
| 4,633,573 | 1/1987 | Scherer | 29/589 |
| 4,680,617 | 7/1987 | Ross | 357/72 |
| 4,684,975 | 8/1987 | Takiar et al. | 357/70 |
| 4,722,060 | 1/1988 | Quinn et al. | 364/490 |
| 4,733,461 | 3/1988 | Nakano | 29/830 |
| 4,763,188 | 8/1988 | Johnson | 357/74 |
| 4,796,078 | 1/1989 | Phelps, Jr. et al. | 357/68 |
| 4,821,148 | 4/1989 | Kobayashi et al. | 361/392 |
| 4,823,234 | 4/1989 | Konishi et al. | 361/386 |
| 4,829,403 | 5/1989 | Harding | 361/386 |
| 4,833,568 | 5/1989 | Berhold | 361/383 |
| 4,839,717 | 6/1989 | Phy et al. | 357/74 |
| 4,855,868 | 8/1989 | Harding | 361/386 |
| 4,862,245 | 8/1989 | Pashby et al. | 357/70 |
| 4,862,249 | 8/1989 | Carlson | 357/80 |
| 4,878,106 | 10/1989 | Sachs | 357/72 |
| 4,884,237 | 11/1989 | Mueller et al. | 365/63 |
| 4,891,789 | 1/1990 | Quattrini et al. | 365/63 |

(List continued on next page.)

FOREIGN PATENT DOCUMENTS

| | | | |
|---|---|---|---|
| 57-31166 | 2/1982 | Japan . | |
| 58-96756 | 6/1983 | Japan . | |
| 58-112348 | 7/1983 | Japan . | |
| 61-163652 | 1/1985 | Japan . | |
| 60-180150 | 9/1985 | Japan . | |
| 63-153849 | 6/1988 | Japan . | |
| 63-53959 | 8/1988 | Japan . | |
| 0125440 | 5/1991 | Japan | 257/717 |
| 0194954 | 8/1991 | Japan | 257/686 |
| 0207061 | 7/1992 | Japan | 257/717 |

Primary Examiner—Kevin M. Picardat
Attorney, Agent, or Firm—Fulbright & Jaworski L.L.P.

[57] ABSTRACT

A method and apparatus for achieving a three-dimensional high density warp-resistant integrated circuit module is provided. Selected individual integrated circuit packages which comprise the module are mounted with a thin stiffener, or a thin layer of material having a coefficient of thermal expansion (CTE) less than or equal to that of silicon, and/or are lapped to reduce the package profile, and/or are mounted with a thin layer of material having a CTE greater than that of silicon, and preferably approximately equal to that of the casing material.

7 Claims, 4 Drawing Sheets

U.S. PATENT DOCUMENTS

| | | | |
|---|---|---|---|
| 4,948,645 | 8/1990 | Holzinger et al. | 156/252 |
| 4,953,005 | 8/1990 | Carlson et al. | 357/80 |
| 4,953,060 | 8/1990 | Lauffer et al. | 361/388 |
| 4,994,411 | 2/1991 | Naito et al. | 437/217 |
| 4,997,517 | 3/1991 | Parthasarathi | 156/630 |
| 5,014,113 | 5/1991 | Casto | 357/70 |
| 5,016,138 | 5/1991 | Woodman | 361/381 |
| 5,041,015 | 8/1991 | Travis | 439/492 |
| 5,049,527 | 9/1991 | Merrick et al. | 437/220 |
| 5,057,906 | 10/1991 | Ishigami | 357/80 |
| 5,065,277 | 11/1991 | Davidson | 361/383 |
| 5,086,018 | 2/1992 | Conru et al. | 437/237 |
| 5,089,876 | 2/1992 | Ishioka | 357/70 |
| 5,099,393 | 3/1992 | Bentlage et al. | 361/413 |
| 5,108,553 | 4/1992 | Foster et al. | 29/852 |
| 5,134,463 | 7/1992 | Yamaguchi | 257/677 |
| 5,138,430 | 8/1992 | Gow, 3rd et al. | 357/70 |
| 5,138,434 | 8/1992 | Wood et al. | 357/74 |
| 5,139,969 | 8/1992 | Mori | 437/183 |
| 5,147,822 | 9/1992 | Yamazaki et al. | 437/215 |
| 5,151,559 | 9/1992 | Conru et al. | 174/52.4 |
| 5,155,063 | 10/1992 | Tada | 437/211 |
| 5,157,478 | 10/1992 | Ueda et al. | 257/675 |
| 5,214,845 | 6/1993 | King et al. | 29/841 |
| 5,216,283 | 6/1993 | Lin | 257/717 |
| 5,223,739 | 6/1993 | Katsumata et al. | 257/676 |
| 5,266,834 | 11/1993 | Nishi et al. | 257/706 |
| 5,343,075 | 8/1994 | Nishino | 257/686 |
| 5,367,766 | 11/1994 | Burns et al. | 29/848 |
| 5,369,056 | 11/1994 | Burns et al. | 438/118 |
| 5,491,612 | 2/1996 | Nicewarner, Jr. | 257/686 |

THREE-DIMENSIONAL WARP-RESISTANT INTEGRATED CIRCUIT MODULE METHOD AND APPARATUS

This application is a divisional of application Ser. No. 08/514,294, filed Aug. 11, 1995, now issued as U.S. Pat. No. 5,801,437; which is a continuation-in-part of application Ser. No. 08/280,968, filed Jul. 27, 1994, now issued as U.S. Pat. No. 5,581,121; which is a division of application Ser. No. 08/037,830, filed Mar. 29, 1993, now issued as U.S. Pat. No. 5,369,056.

BACKGROUND OF THE INVENTION

1. Field of the Invention

This invention relates to a three-dimensional warp-resistant integrated circuit module. In particular, the invention relates to thin layers of material mounted to selected integrated circuit packages within the module to balance moments of inertia around a selected neutral thermodynamic axis within the module to prevent thermal and mechanical warping of the module.

2. Discussion of the Related Technology

In an attempt to configure electronic systems in ever smaller packages, new methods and apparatus comprising three-dimensional stacked integrated circuit packages have been developed as more fully described in U.S. Pat. No. 5,420,751, entitled "Ultra High Density Integrated Circuit Packages," and U.S. Pat. No. 5,367,766, entitled "Ultra High Density Integrated Circuit Packages Method," both having the common assignee of the present invention and incorporated herein by reference for all purposes. U.S. patent application Ser. No. 07/990,334, filed Dec. 11, 1992, now allowed, entitled "High Density Lead-on-Package," assigned to the common assignee of the present invention and incorporated herein, discloses the use of a stiffener to prevent the mechanical warping of a thin integrated circuit package. Methods and apparatus for controlling thermally induced warpage are discussed in U.S. Pat. No. 5,369,056, entitled "Warp-Resistant Ultra Thin Package" and in U.S. Pat. No. 5,369,058, entitled "Warp-Resistant Ultra Thin Packages Method," both assigned to the common assignee of the present invention and incorporated herein for all purposes.

In contrast to such prior art technology, the present invention includes a three-dimensional warp-resistant integrated circuit module that is thermally and mechanically balanced to prevent ultra-thin profile packages comprising the module from warping.

SUMMARY OF THE INVENTION

In order to achieve a low profile three-dimensional integrated circuit module, individual ultra-thin high-density integrated circuit packages are utilized. During the manufacture of the module, the individual integrated circuit packages are made thinner by lapping, or grinding off, some casing material from the individual packages. A thinner integrated circuit package, however, may warp during fabrication or in operation due to dissimilar coefficients of thermal expansion (CTE) in the various layers or component parts which comprise the packages. To prevent warping while still maintaining a thin profile, a thin layer of material having a CTE that is equal to or less than the CTE of silicon, and preferably having a relatively high Young's modulus or resistance to longitudinal bending is mounted to a major surface of one or more of the ultra-thin integrated circuit packages of the module. Thereafter, the package height or profile of the individual integrated circuit packages may be reduced by grinding or lapping the unaffected major surfaces. A suitable material for such a stiffener is INVAR.

This material may be mounted to the major surface of an integrated circuit package using a high temperature epoxy having a plasticizer that permits expansion without cracking, such as Able Film™. The selected epoxy should also have a good shear characteristic at high temperature and good resistance to moisture penetration. Alternatively, a high temperature thermoplastic without plasticizer, such as AbleLog™ T1-5501, may be used in less environmentally demanding applications.

An integrated circuit package is made thinner by removing a portion of the major surface of the integrated circuit package uniformly to the point where the desired thickness is achieved. The removal of some of the major surface of the integrated circuit package will include the casing material and may include some portion of the inactive face of the integrated circuit die within the package.

In an alternative embodiment, to reduce the tendency of an individual package to warp due to differential thermal expansion, a thin layer of material having a CTE greater than the CTE of silicon, and preferably approximately equal to that of the casing material, is mounted to a major surface of at least one integrated circuit package within the module. The material having a CTE greater than that of silicon may be, for example, aluminum or copper. This material can be mounted to the major surface of the integrated circuit package with a high temperature epoxy similar to that used with the stiffener. The thin layer having a CTE greater than silicon and the thin layer having a CTE less than silicon may be mounted on opposite surfaces of the same package.

The thickness of the layers of the materials mounted to the upper and/or lower major surfaces of the selected integrated circuit packages within the module depends on the desired thermal balance for the entire module. When an individual integrated circuit package within the module is cooled after it is cured, it tends to warp due to thermal imbalances in the different materials that make up the layers comprising the integrated circuit package. This tendency to warp also occurs where the integrated circuit packages within the module are made thinner. Unless warpage is controlled, the packages, and thus the three-dimensional module, will bow unacceptably upon cooling from the integrated circuit package bonding temperature to the different temperature experienced by the modules during storage and operation. An unacceptable level of warping may be as little as one mil but certainly includes three mils. This level of warping detracts from the integrity of the module and may induce cracking of the die within each individual package.

The potential for package bow results from the method of package construction which utilizes stacked layers of different materials, with each material exhibiting a different CTE. Each material layer, upon cooling, seeks its new dimensions according to its CTE, but is restrained by the presence of the other material layers which make up the package. The forces produced by these restraining layers, if not minimized and balanced by proper design, materials selection, and construction, can produce undesirable bow, or warpage.

The present invention provides an apparatus and method of warpage control that minimizes the differential thermal expansion forces and moments between material layers of individual integrated circuit packages on either side of a selected neutral thermodynamic axis passing through the three-dimensional module. The total warpage-causing moments for each layer of each package, on either side of the selected neutral thermodynamic axis, are summed. For a particular layer of a package, such as the casing material, the stiffener material, the lead frame within each package, etc., the moment, m, is proportional to the following product:

$$m = (E)(h)(t)\Delta(a)\Delta(T)$$

where m is the moment of the particular layer; E is the Young's modulus of elasticity of the layer; h is the moment-arm distance of the center of the layer from the neutral thermodynamic axis; t is the layer thickness; $\Delta(a)$ is the difference in CTE of the layer and that of the material containing the selected neutral thermodynamic axis; and $\Delta(T)$ is the temperature difference between assembly bonding temperature and operation, storage, or other temperatures of interest. The product $\Delta(a)\Delta(T)$ is the source of forces and moments for each layer, the product $(E)(t)$ is the deflection compliance of the layer with the differential force, and h is the lever arm allowing the force to produce a moment with its resulting warpage.

The product in the above equation for moment, m, is evaluated for each layer of materials disposed on one side of the selected neutral thermodynamic axis through the module. These values are then summed. This process is repeated for each material layer for each package on the opposite side of the selected neutral thermodynamic axis. The two sums are then compared. The materials for the layers of each package within the module and the dimensions of each are adjusted until the moment sums on both sides of the selected neutral axis are either equal, or are sufficiently close to being equal to assure acceptably low values of warpage. In other words, the vectorial summation of all of the moments about the selected neutral axis for the module is as close to zero as possible.

A key advantage of the present invention is that the different materials for each layer of each package can be asymmetrically located within each package within the module and thereby thermally balanced. Thus, the integrated circuit die within each package does not have to be symmetrically centered within the package to achieve thermal balance throughout the module.

DETAILED DESCRIPTION OF THE PREFERRED EMBODIMENT

Figure 1:
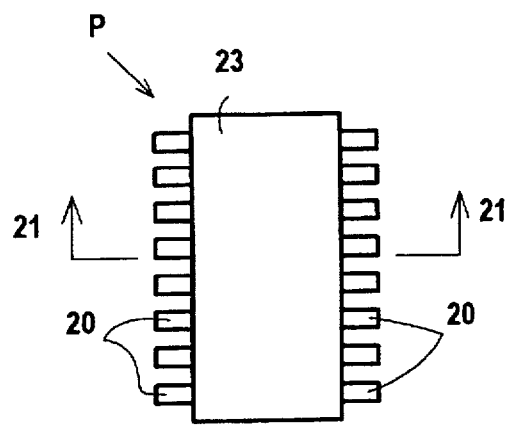
FIG. 1 is a schematic plan view of a prior art standard integrated circuit package.
Figure 2:
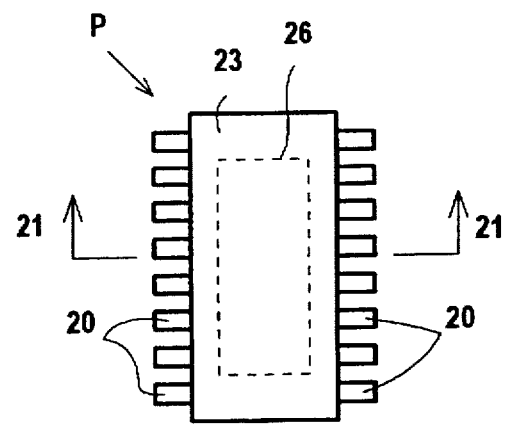
FIG. 2 is a schematic plan view of a prior art standard integrated circuit package illustrating the position of the integrated circuit die.
Figure 3:
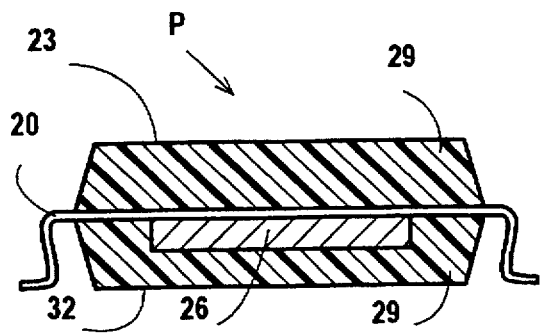
FIG. 3 is a schematic cross-sectional view of FIGS. 1 or 2 taken along section line 21—21.

Referring now to FIGS. 1, 2 and 3, a standard integrated circuit package P is illustrated in schematic plan view and schematic cross-sectional view. The standard integrated circuit package P comprises an integrated circuit die 26 surrounded by casing material 29, which is provided with an array of leads 20 for circuit interconnections. A standard integrated circuit package P includes a silicon integrated circuit die 26 having a nominal thickness of from about eight to about sixteen mils. It should be noted that in the drawings, the conductive leads 20 are illustrated as being connected at or near the edge of the integrated circuit die 26 for clarity, when, as is known to practitioners in the art, lead frames may well extend over the die and bond to designated sites in the center of the die. It should also be noted that the present invention is not limited to embodiments having leads exiting on two sides and can be readily fabricated to accommodate single or four-sided lead configurations, in either J-lead, gull-wing or other surface mount technology (SMT) lead configurations.

Figure 4:
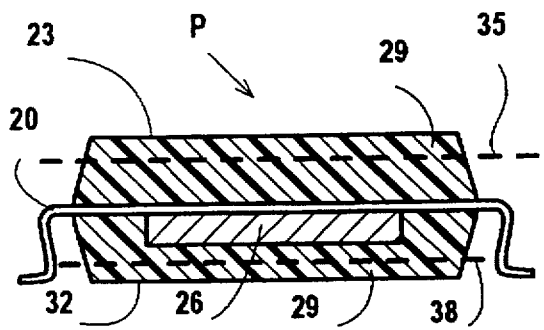
FIG. 4 is a schematic cross-sectional view of FIGS. 1 or 2 taken along section line 21—21 illustrating the removal of some casing material from the upper and lower major surfaces of the integrated circuit package.
Figure 5:
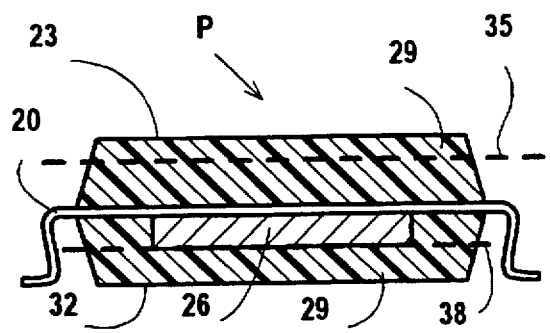
FIG. 5 is a schematic cross-sectional view of FIGS. 1 or 2 taken along section line 21—21 illustrating the removal of some casing material and removal of some of the integrated circuit die.

Since the principle objective of this invention is to achieve thin, yet durable, and warp-resistant reliable circuit packaging, it is important that the molded casing of the packages P be made as thin as possible without breaking, warping or destroying the integrity of package P. Referring now to FIGS. 4 and 5, a schematic cross-sectional view of FIGS. 1 or 2 taken along section line 21—21 illustrates the reduction in overall thickness of the integrated circuit package P primarily by removing some casing material 29 uniformly across the upper major surface 23 and/or the lower major surface 32 of the integrated circuit package P until the overall thickness desired is achieved. The casing material 29 is removed from surfaces 23 and 32 of the integrated circuit package P by lapping and/or grinding. When only a surface preparation is required on upper surface 23, a chemical wash solution may be utilized to prepare the surface for bonding to a stiffener, or the like. Alcohol-based solvents are preferred to enhance vapor barrier adhesion on unlapped surfaces. Alternatively, clean-burning flames from hydrogen or propane may be used to remove wax and other residual elements prior to adhesion of laminated material to the package surface.

Figure 5A:
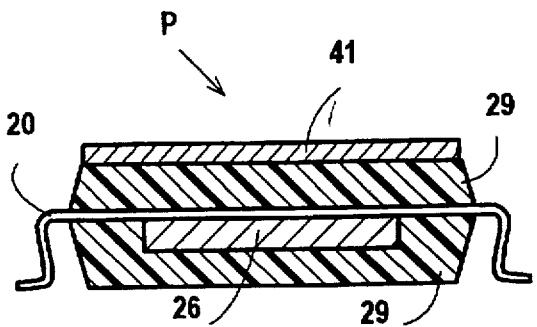
FIG. 5a is a schematic cross-sectional view of an integrated circuit package including a stiffener layer.

A thinner integrated circuit package P may warp during fabrication or use due to dissimilar coefficients of thermal expansion in the various layers or component parts which comprise the package P. As illustrated in FIG. 5a, to prevent warping while still maintaining a thin profile, a stiffener, or thin layer of material 41 having a coefficient of thermal expansion (CTE) less than that of silicon, and preferably having a relatively high resistance to bending, for example, INVAR, an iron-nickel based compound approximately 63% iron and 46% nickel, is mounted to upper major surface 23 of the integrated circuit package P. Preferably, upper surface 23 of package P is not thinned or lapped prior to material layer 41 mounted thereto.

Figure 7:
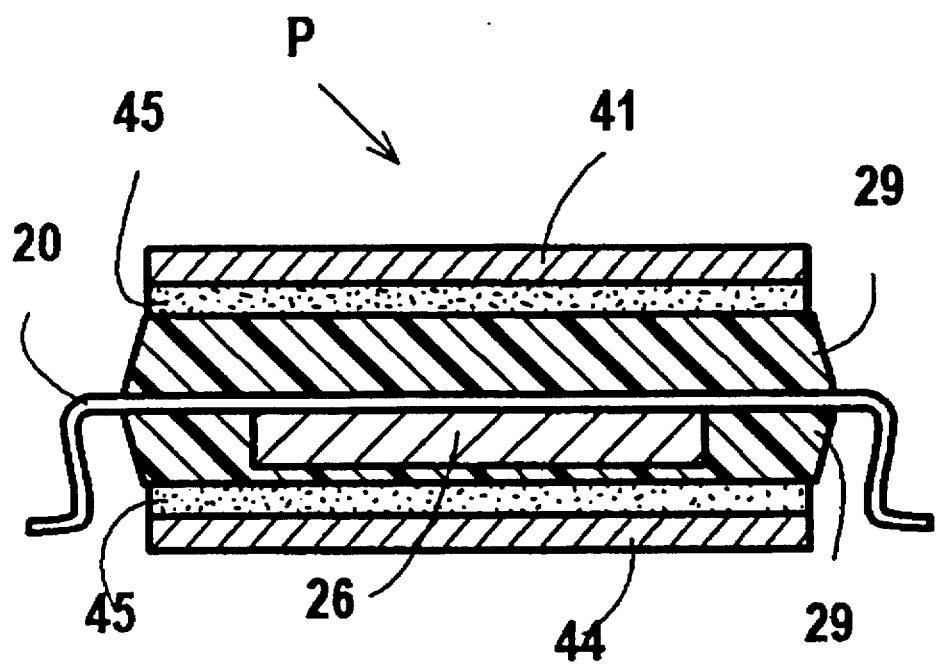
FIG. 7 is a schematic cross-sectional view of an embodiment of the package P of the present invention illustrating the mounting of the materials to the upper and lower major surfaces of the integrated circuit package with a thin layer of high temperature epoxy containing a plasticizer which permits expansion without cracking.

As shown in FIG. 7, one possible method of mounting material 41 is by using a high temperature epoxy 45 containing a plasticizer that permits expansion without cracking. An example of a suitable epoxy 45 is Able Film™. The selected epoxy should also have a good shear characteristic at high temperature, and good resistance to moisture penetration. Alternatively, a high temperature thermoplastic without plasticizer, such as AbleLog™ T1-5501, may be used in less environmentally demanding applications. Next, the thickness integrated circuit package P is further reduced by removing some of the casing material 29 uniformly across the lower major surface 32 of the integrated circuit package P until the overall desired thickness of package P is achieved.

Figure 6:
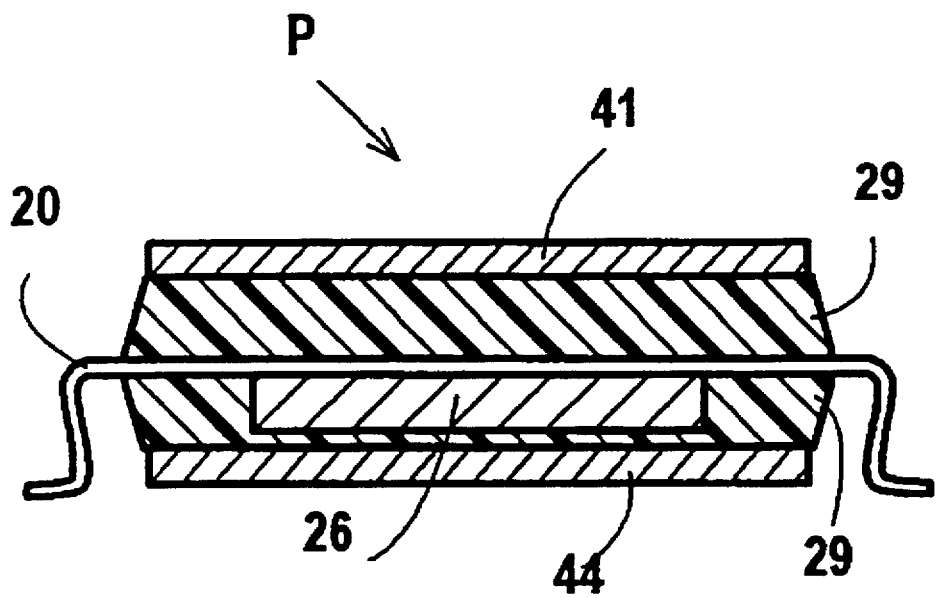
FIG. 6 is a schematic cross-sectional view of an embodiment of the package P of the present invention illustrating the mounting of the materials to the upper and lower major surfaces of the integrated circuit package.

In an alternative embodiment, as illustrated in FIG. 6, after some of the casing material 29 is removed from surface 32, a thin layer of material 44 having a CTE greater than that of silicon, preferably approximately equal to that of the casing material 29, is mounted to surface 32 of the integrated circuit package P to prevent warping. An example of a suitable material 44 is aluminum or copper. As shown in FIG. 7, one suitable method of mounting material 44 is by using a high temperature epoxy 45 similar to that used on the upper major surface 23. An example of a suitable epoxy 45 is Able Film™.

Figure 8:
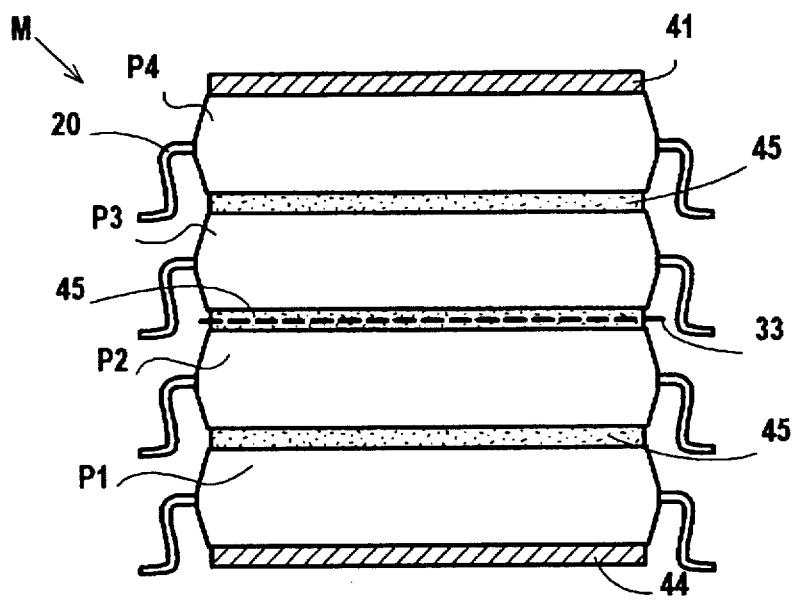
FIG. 8 is a side view of an embodiment of module M of the present invention.

As illustrated in FIG. 8, module M includes a plurality of individual integrated circuit packages P horizontally oriented and mounted together to form three-dimensional module M. As previously discussed, various methods of fabricating a three-dimensional integrated circuit module M have been developed. These methods and apparatus have been assigned to the common assignee of the present invention.

The present invention provides an apparatus and method for controlling warpage which minimizes the total warpage of the entire module M in a manner similar to that previously described with respect to each individual integrated circuit package P within module M. To achieve this, a neutral thermodynamic axis is selected within module M. As illustrated in FIG. 8, axis 33 is preferably situated in the approximate center of module M. Here, axis 33 passes through adhesive layer 45 which joins the upper portion 31 of the casing of package $P_2$ with the lower portion 35 of the casing of adjacent package $P_1$. The differential thermal expansion forces and moments between each of the layers of material which comprise the upper and lower halves of module M lying on either side of the selected neutral thermodynamic axis 33, are balanced to minimize the overall warpage of the module M. The total warpage causing moments on either side of the selected neutral thermodynamic axis 33 are equal to the sum of moments associated with each layer of material, relative to the selected neutral thermodynamic axis 33. For a particular material layer, the moment, m, is proportional to the following product:

$$m = (E)(h)(t)A(a)A(T)$$

where m is the moment of the particular layer; E is the Young's modulus of elasticity of the layer; h is the moment-arm distance of the center of the layer from the neutral thermodynamic axis; t is the layer thickness; $\Delta(a)$ is the difference in CTE of the layer and that of the material containing the neutral thermodynamic axis; and $\Delta(T)$ is the temperature difference between assembly bonding temperature and operation, storage, or other temperatures of interest.

The product $\Delta(a)\Delta(T)$ is the source of forces and moments for a particular layer, the product (E)(t) is the deflection compliance of the layer with the differential force, and h is the lever arm allowing the force to produce a moment with its resulting warpage. The product in the above equation for moment, m, is evaluated for each layer of material on one side of the selected neutral thermodynamic axis and these values summed. The process is repeated for each layer of material situated on the opposite side of the neutral thermodynamic axis. The two sums are then compared.

Figure 9:
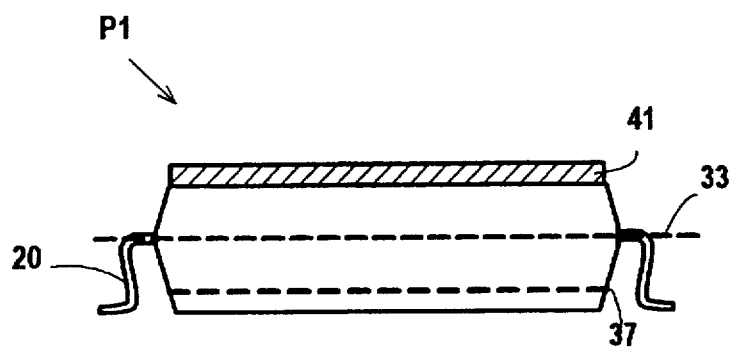
FIG. 9 is a side view of a level-one package P of the present invention.

In another embodiment of a three-dimensional warp-resistant module M, shown in FIG. 9, a thin layer of material 41 having a relatively high Young's modulus, and a CTE less than that of silicon, for example, INVAR, is mounted to an upper surface of a package $P_1$. The lower major surface of package $P_1$ is lapped, shown by hashed line 37, to reduce the relative thickness of package P. Preferably, the lapping extends into the inactive side of the die to achieve maximum height reduction. This embodiment controls warpage for package $P_1$, where the neutral thermodynamic axis 33 is preferably selected to run through the approximate center of package $P_1$. The sum of the moments of the materials on each side of axis 33 should be approximately zero, to thermodynamically balance package $P_1$ to make it warp-resistant.

Figure 10:
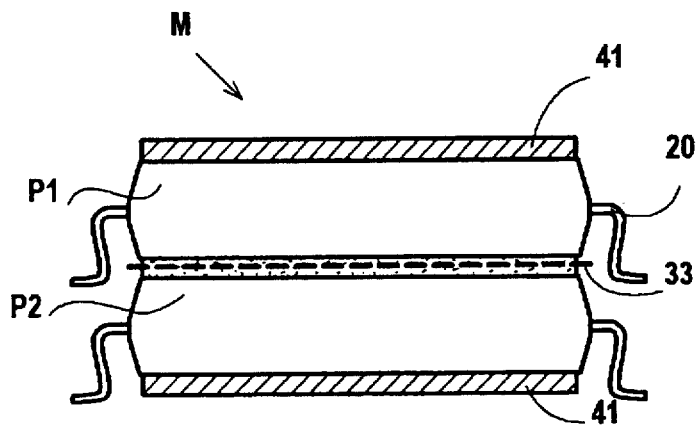
FIGS. 10 and 11 illustrate side views of additional embodiments of module M of the present invention.

As shown in FIG. 10, this package $P_1$, is then mounted to an adjacent individual package $P_2$ which also has a thin layer of material 41 having a CTE less than that of silicon and having a high resistance to longitudinal bending, such as INVAR, mounted to one of its two major surfaces, with the remaining major surface having been lapped to reduce the overall thickness of the package $P_2$. The lapped surfaces of the two packages $P_1$ and $P_2$ are then mounted together with a high temperature epoxy, as described previously, or by an adhesive such as Locks Studs® brand adhesive, #81791, by Permatex Industrial of Newington, Conn. A high strength adhesive is preferred in this embodiment to prevent the moments of the forces of the packages $P_1$ and $P_2$ from pulling module M apart where $P_1$ and $P_2$ are joined. This embodiment is most preferably utilized with lower operational temperatures. In this embodiment, warpage is controlled for the module M since the thermal expansion forces are balanced about axis 33 and due to the increased rigidity provided by the lamination of two packages together.

In embodiments where warpage cannot be controlled by single sided application of Invar or other materials alone, it may be necessary to apply laminations on opposite sides of packages P. In such applications, a first layer of material 41 having a CTE less than that of silicon, but greater than that of the case material is applied on one surface of selected packages P and a second layer of material 44 having a CTE greater than that of silicon on opposite major surfaces of selected packages P to balance the thermodynamic forces of each package P comprising the module M. It may not be necessary that every package P within such a module M have such layers of material on opposite sides of the package to balance the moments and forces of the individual package P. It is desirable to use as few layers of material as necessary to balance the overall module M. Thus, depending on the placement of the packages P within the module, and the selection of the neutral thermodynamic axis within the module, various combinations of thin layers of material having CTE's less than silicon, or greater than the CTE of silicon and preferably equal to the casing material, are mounted to those packages P within the module M such that the vectorial sum of the moments of all material layers around the selected neutral thermodynamic axis of the module M balance. In other words, vectorial summation of all moments of each layer of material utilized on both sides of the selected neutral axis is as close to zero as possible.

Figure 11:
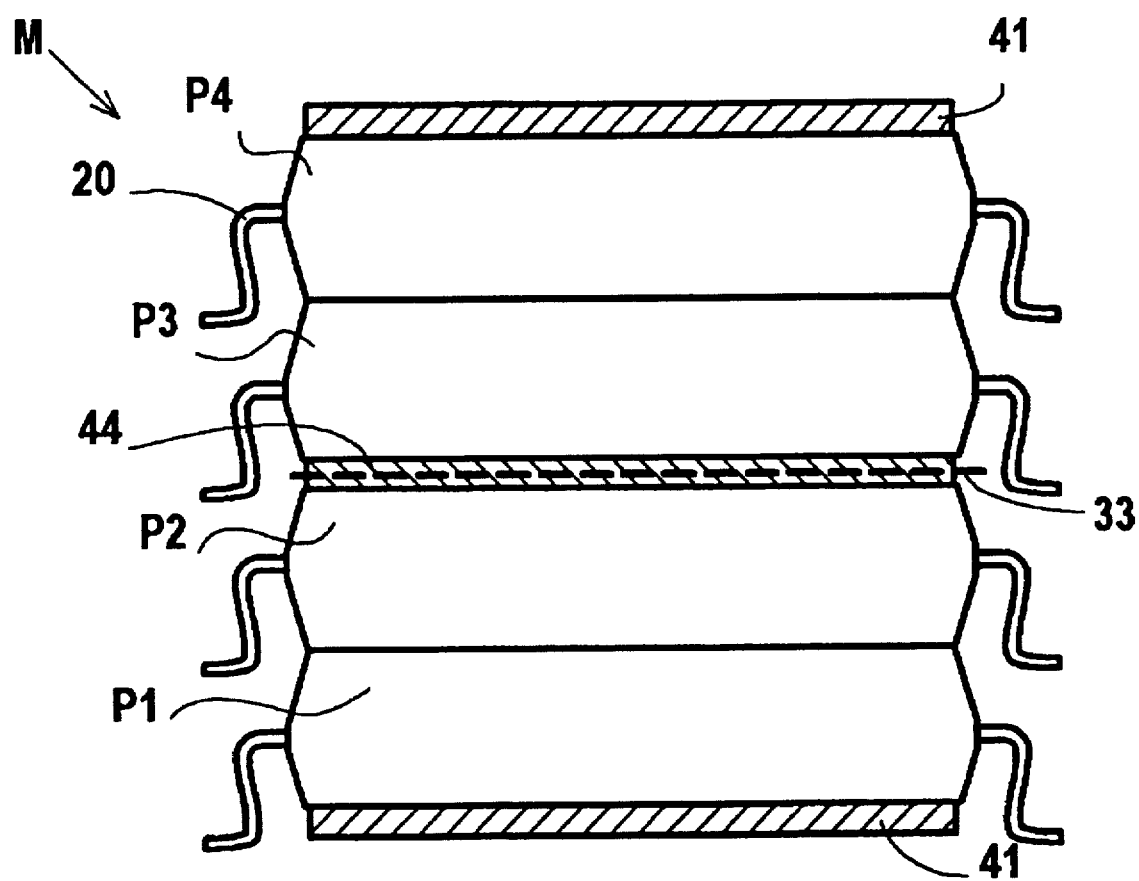

Referring now to FIG. 11, a four-high stack of pages $P_1$–$P_4$ is shown as module M. A layer of material 41 is mounted to package $P_1$ by an adhesive, as previously described. A layer of material 41 is also mounted to package $P_4$. Between packages $P_2$ and $P_3$, a layer of material 44 having a CTE greater than that of silicon is mounted. To achieve a warp-resistant, thermally balanced module under higher operating temperatures with a neutral thermodynamic axis 33 selected to run through material 44 layer, the moments of the forces of all layers of material on each side of axis 33 should be equal. Thus, the thickness of layers of material 41 and material 44 are selected to achieve this thermodynamic balance, by using the thermodynamic balancing process previously described. In this embodiment, the two packages, $P_1$ and $P_2$, above axis 33 and the two packages, $P_3$ and $P_4$, below axis 33, are in thermal balance. Thus, module M is made warp-resistant, and is in thermal balance around axis 33. Other combinations of layers of material 41 and material 44 can be utilized, as long as the sum of the moments around selected axis is substantially zero. Axis 33 can be selected as running through any layer within module M.

A key advantage of the present invention is that one can asymmetrically locate the integrated circuit die 14 with each package P. Package P does not have to be symmetrically centered in each package P to obtain thermal balance throughout the module M. Application of the method of the present invention allows one to compensate for material and orientation asymmetries in each integrated circuit package P to prevent overall warping of the module M.

The foregoing disclosure and description of the invention are illustrative and explanatory of the preferred embodiments, and changes in the size, shape, materials and individual components, circuit elements, connections and construction may be made without departing from the spirit of the invention.

What is claimed is:

1. A method of manufacturing a three-dimensional warp-resistant integrated circuit module, comprising the steps of:

stacking a plurality of integrated circuit packages to form a three-dimensional integrated circuit module, wherein each said package includes a first and a second major surface;

selecting a neutral thermodynamic axis through said integrated circuit module; and mounting a stiffener to a major surface of at least one said integrated circuit package comprising said module, wherein the orientation of said stiffener is selected such that the vectorial summation of the moment of layers of material comprising each said package forming said module around said neutral axis is as close to zero as possible, where $$m=(E)(h)(1)\Delta(a)\Delta(T)$$

with: m being the moment of the layer of material being calculated; E being the Young's modulus of elasticity of the material layer; h being the moment-arm distance of the center of the layer from said selected neutral axis; $\Delta(a)$ being the difference in CTE of the layer and of the material containing said selected neutral axis; and $\Delta(T)$ being the temperature difference between assembling bonding temperature, operation and storage temperature.

2. The method of claim 1, wherein said stiffener comprises a thin layer of material having a coefficient of thermal expansion less than that of silicon.

3. The method of claim 1, wherein said stiffener comprises a thin layer of material having a coefficient of thermal expansion greater than that of silicon.

4. The method of claim 1, further comprising the step of reducing the height of one or more of said integrated circuit packages comprising said module.

5. The method of claim 4, wherein said step of reducing is accomplished by lapping a major surface of said one or more integrated circuit packages.

6. The method of claim 4, wherein said stage of reducing is accomplished by grinding a major surface of said one or more integrated circuit packages.

7. The method of claim 4, wherein said step of reducing is accomplished by washing a major surface of said one or more integrated circuit packages with a chemical solution.

* * * * *